United States Patent
Hartfield et al.

(10) Patent No.: US 6,435,398 B2
(45) Date of Patent: Aug. 20, 2002

(54) METHOD FOR CHEMICALLY REWORKING METAL LAYERS ON INTEGRATED CIRCUIT BOND PADS

(75) Inventors: Cheryl Hartfield, McKinney; Thomas M. Moore, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/864,574

(22) Filed: May 24, 2001

Related U.S. Application Data

(60) Provisional application No. 60/208,674, filed on Jun. 1, 2000.

(51) Int. Cl.[7] ............................................. B23K 31/10
(52) U.S. Cl. ........................................ 228/103; 228/119
(58) Field of Search ..................... 228/103, 119, 228/8; 216/37, 21; 438/694

(56) References Cited

U.S. PATENT DOCUMENTS

| | | | |
|---|---|---|---|
| 5,079,070 A | * | 1/1992 | Chalco et al. .............. 156/233 |
| 5,449,108 A | * | 9/1995 | Park .......................... 228/103 |
| 6,054,659 A | * | 4/2000 | Lee et al. ................... 200/181 |
| 6,211,527 B1 | * | 4/2001 | Chandler ................. 250/492.2 |

* cited by examiner

*Primary Examiner*—Tom Dunn
*Assistant Examiner*—Jonathan Johnson
(74) *Attorney, Agent, or Firm*—Gary C. Honeycutt; Fred Telecky; Arthur I. Navarro

(57) ABSTRACT

A method for reworking integrated circuit (IC) wafers having copper-metallized bond pads covered by deposited layers of a barrier metal and a bondable metal. After identifying the wafers with off-spec metal layers, the wafers are chemically etched using selective etchants consecutively until the metal layers over the bond pads are removed without damaging the copper metallization. Replacement metal layers are finally deposited over the bond pads. Specifically, the bondable metal, such as gold, is selectively removed by a cyclic dithio-oxamine compound, dissolved in tetra-hydro-furane or acetone. The barrier metals, such as nickel and palladium, are removed by a mixture of inorganic and organic oxidizing acids.

14 Claims, 1 Drawing Sheet

METHOD FOR CHEMICALLY REWORKING METAL LAYERS ON INTEGRATED CIRCUIT BOND PADS

This application claims priority from Provisional application Ser. No. 60/208,674, filed Jun. 1, 2000.

FIELD OF THE INVENTION

The present invention is related in general to the field of semiconductor devices and processes and more specifically to a method for chemically reworking metal layer misprocessed on bond pads of integrated circuits having copper metallization.

DESCRIPTION OF THE RELATED ART

In integrated circuits (IC) technology, pure or doped aluminum has been the metallization of choice for interconnection and bond pads for more than four decades. Main advantages of aluminum include ease of deposition and patterning. Further, the technology of bonding wires made of gold, copper, or aluminum to the aluminum bond pads has been developed to a high level of automation, miniaturization, and reliability. Examples of the high technical standard of wire bonding to aluminum can be found in U.S. Pat. No. 5,455,195, issued on Oct. 3, 1995 (Ramsey et al., "Method for Obtaining Metallurgical Stability in Integrated Circuit Conductive Bonds"); U.S. Pat. No. 5,244,140, issued on Sep. 14, 1993 (Ramsey et al., "Ultrasonic Bonding Process Beyond 125 kHz"); U.S. Pat. No. 5,201,454, issued on Apr. 13, 1993 (Alfaro et al., "Process for Enhanced Intermetallic Growth in IC Interconnections"); and U.S. Pat No. 5,023,697, issued on Jun. 11, 1991 (Tsumura, "Semiconductor Device with Copper Wire Ball Bonding").

In the continuing trend to miniaturize the ICs, the RC time constant of the interconnection between active circuit elements increasingly dominates the achievable IC speed-power product. Consequently, the relatively high resistivity of the interconnecting aluminum now appears inferior to the lower resistivity of metals such as copper. Further, the pronounced sensitivity of aluminum to electromigration is becoming a serious obstacle. Consequently, there is now a strong drive in the semiconductor industry to employ copper as the preferred interconnecting metal, based on its higher electrical conductivity and lower electromigration sensitivity. From the standpoint of the mature aluminum interconnection technology, however, this shift to copper is a significant technological challenge.

Copper has to be shielded from diffusing into the silicon base material of the ICs in order to protect the circuits from the carrier lifetime-killing characteristic of copper atoms positioned in the silicon lattice. For bond pads made of copper, the formation of thin copper(I)oxide films during the manufacturing process flow has to be prevented, since these films severely inhibit reliable attachment of bonding wires, especially for conventional gold-wire ball bonding. In contrast to aluminum oxide films overlying metallic aluminum, copper oxide films overlying metallic copper cannot easily be broken by a combination of thermocompression and ultrasonic energy applied in the bonding process. As further difficulty, bare copper bond pads are susceptible to corrosion.

In order to overcome these problems, a process has been disclosed to cap the clean copper bond pad with a layer of aluminum and thus re-construct the traditional situation of an aluminum pad to be bonded by conventional gold-wire ball bonding. A suitable bonding process is described in U.S. Pat. No. 5,785,236, issued on Jul. 28, 1998 (Cheung et al., "Advanced Copper Interconnect System that is Compatible with Existing IC Wire Bonding Technology"). The described approach, however, has several shortcomings.

First, the fabrication cost of the aluminum cap is higher than desired, since the process requires additional steps for depositing metal, patterning, etching, and cleaning. Second, the cap must be thick enough to prevent copper from diffusing through the cap metal and possibly poisoning the IC transistors. Third, the aluminum used for the cap is soft and thus gets severely damaged by the markings of the multiprobe contacts in electrical testing. This damage, in turn, becomes so dominant in the ever decreasing size of the bond pads that the subsequent ball bond attachment is no longer reliable.

A low-cost structure and method for capping the copper bond pads of copper-metallized ICs has been disclosed on U.S. Patent Application No. 60/183,405, filed on Feb. 18, 2000. The present invention is related to that application. The structure provides a metal layer electrolessly plated onto the copper, which impedes the up-diffusion of copper. Of several possibilities, nickel is a preferred choice. This layer is topped by a bondable metal layer, which also impedes the up-diffusion of the barrier metal. Of several possibilities, gold is a preferred choice. In a variation of this sequence of metal layers, a second barrier layer such as palladium is electrolessly deposited on the nickel, blocking its up-diffusion, and then followed by a bondable metal such as gold. Metallurgical connections to the stacked cap of layers can then be performed by conventional wire bonding.

It is difficult, though, to plate these bond pad caps uniformly in electroless deposition systems, because electroless deposition is affected by local reactant concentrations and by the agitation velocities of the aqueous solution. Deposition depletes the reactants in areas around the bond pads. Increasing the agitation of the solution only exacerbates the deposition non-uniformity, which is influenced by the flow direction of the solution. Also, a few bond pads may not receive any metal deposition. The problem is further complicated when a whole batch of wafers is to be plated simultaneously in order to reduce cost, since known control methods have been applied only to process single wafers under applied electrical bias. See, for example, U.S. Pat. No. 5,024,746, issued Jun. 18, 1991, and U.S. Pat. No. 4,931,149, issued Jun. 5, 1990 (Stierman et al., "Fixture and a Method for Plating Contact Bumps for Integrated Circuits").

An urgent need has arisen for a reliable method of reworking metal caps over copper bond pads which combines minimum fabrication cost with maximum correction control of the IC structure. The reworking method should be flexible enough to be applied for different IC product families and a wide spectrum of design and process variations. Preferably, these innovations should be accomplished while shortening production cycle time and increasing throughput, and without the need of expensive additional manufacturing equipment.

SUMMARY OF THE INVENTION

The present invention discloses a method for reworking integrated circuit (IC) wafers having copper-metallized bond pads covered by deposited layers of a barrier metal and a bondable metal. After identifying the wafers with off-spec metal layers, the wafers are chemically etched using selective etchants consecutively until the metal layers over the bond pads are removed without damaging the copper metallization. Replacement metal layers are finally deposited over the bond pads.

The present invention is related to high density and high speed ICs with copper interconnecting metallization, especially those having high numbers of metallized inputs/outputs, or "bond pads". These circuits can be found in many device families such as processors, digital and analog devices, logic devices, high frequency and high power devices, and in both large and small area chip categories.

It is an aspect of the present invention to increase the process yield of wafer fabrication, since it provides a low-cost rework method for wafers misprocessed almost at the end of the process flow. It is towards the completion of the fabrication process when a high amount of work and time has already been invested and the wafers represent high value.

Another aspect of the invention is to support technologies applicable to bond pad area reduction and thus the shrinking of IC chips. Consequently, the invention helps to alleviate the space constraint of continually shrinking applications such as cellular communication, pagers, hard disk drives, laptop computers and medical instrumentation.

Another aspect of the invention is to support the fabrication of bond pad metal caps by the self-defining process of electroless deposition, which is preferable over costly photolithographic and alignment techniques.

Another aspect of the invention is to help advance the process and reliability of wafer-level multi-probing by eliminating probe marks and subsequent bonding difficulties.

Another aspect of the invention is to provide materials and process concepts which are flexible so that they can be applied to many families of semiconductor products, and are general so that they can be applied to several generations of products.

Another aspect of the invention is to use only materials and processes most commonly employed and accepted in the fabrication of advanced IC devices, thus avoiding the cost of new capital investment and using the installed fabrication equipment base.

These aspects have been achieved by the teachings of the invention concerning selection criteria and process flows suitable for mass production. Various modifications have been successfully employed to satisfy different selections of bonding technologies.

In the first embodiment of the invention, a cyclic dithio-oxamine compound, dissolved for instance in tetra-hydrofurane or acetone, is used as a specific etchant to remove the bondable metal layer, usually gold. The preferred compound is epta-methyl-bis-diiodine, or the bis-diiodine adduct of N,N'-dimethylperhydrodiazepine-2,3- dithione.

In the second embodiment of the invention, mixtures of inorganic and organic oxidizing acids are used as specific etchants for removing the barrier metal layer/layers. Dependent on the barrier metals (such as nickel and palladium), the acids are selected from a group consisting of hydrochloric acid, nitric acid, sulfuric acid, phosphoric acid, acetic acid, and hydrogen peroxide and others.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
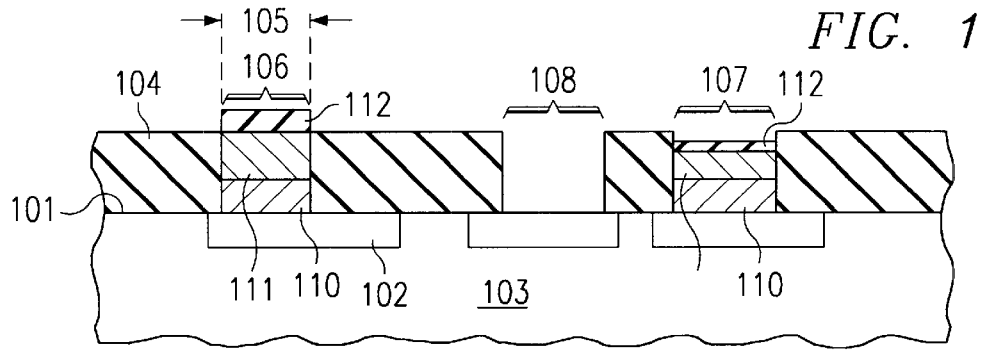
FIG. 1 is a schematic and simplified cross section of a portion of an integrated circuit wafer having off-spec bond pad metal layers, identified for reworking according to the first embodiment process of the invention.

FIG. 1 shows in schematic fashion the cross section of a small portion of an integrated circuit (IC) fabricated on the active surface 101 of a semiconductor wafer. The IC has copper interconnecting metallization, which also provides the metallization for the plurality of bond pads 102. Actually, the copper traces are imbedded in a refractory metal shield (not shown in FIG. 1), which prevents the diffusion of copper into parts of the IC. Typical shield materials include tantalum nitride, tantalum silicon nitride, tungsten nitride, tungsten silicon nitride, titanium, titanium nitride, or titanium tungsten.

Bond pads 102 are surrounded by dielectric IC portions 103, only summarily indicated in FIG. 1. These electrically insulating portions may include not only the traditional plasma-enhanced chemical vapor deposited dielectrics such as silicon dioxide, but also newer dielectric materials having lower dielectric constants, such as silicon-containing hydrogen silsesquioxane, organic polyimides, aerogels, and parylenes, or stacks of dielectric layers including plasma-generated or ozone tetraethylorthosilicate oxide. Since these materials are less dense and mechanically weaker than the previous standard insulators, the dielectric under the copper is often reinforced. Examples can be found in U.S. Patent application No. 60/085,876, filed on May 18, 1998 (Saran et al., "Fine Pitch System and Method for Reinforcing Bond Pads in Semiconductors"), and No. 60/092,961, filed Jul. 14, 1998 (Saran, "System and Method for Bonding over Active Integrated Circuits").

The surface 101 of the semiconductor wafer is covered by a moisture-impenetrable protective overcoat 104. This overcoat is usually made of silicon nitride or silicon oxynitride, commonly 0.5 to 1.0 $\mu$m thick. Windows 105 are opened in the overcoat in order to expose portions of the copper metallization 102. The copper exposed by these openings is commonly referred to as the bond pad metallization.

Since copper is susceptible to corrosion and even thin copper (I)oxide films are difficult to bond to, the U.S. Patent Application No. 60/183,405, filed on Feb. 18, 2000 (to which the present invention is related) provides structures and processes of a cap formed over the exposed copper. According to that application, the cap consists of a metal and has a coordinated thickness such that it satisfies three requirements:

The cap acts as a barrier against the up-diffusion of copper to the surface of the cap where the copper might impede the subsequent wire bonding operation. Specifically, for the cap the metal selection and thickness are coordinated such that the cap reduces the up-diffusion of copper at 250° C. by more than 80% compared with the absence of the barrier metal.

The cap is fabricated by a technique, which avoids expensive photolithographic steps. Specifically, an electroless process is used to deposit the cap metal layer.

The cap metal has a surface which is bondable. Specifically, conventional ball and wedge bonding techniques can be used to connect metal wires and other coupling members metallurgically to the bond pad.

FIG. 1 depicts examples of bond pad caps designed to be a stack of three metal layers, each layer deposited by an electroless plating process. Bond pad 106 shows a satisfactory cap: all three layers are deposited in their predetermined respective thickness ranges.

Layer 110 is positioned over copper area 102, sometimes deposited on a seed metal layer (not shown in FIG. 1). Layer 110 consists of a metal acting as a diffusion barrier against copper. Examples for layer 110 are nickel, cobalt, chromium, molybdenum, titanium, tungsten, and alloys thereof. These metals are inexpensive and can be deposited by electroless plating; however, they are poorly bondable. As mentioned above, in these metals copper has a diffusion coefficient of less than $1 \times 10E-23$ cm$^2$/s at 250° C. Consequently, these metals are good copper diffusion barriers. The layer thicknesses, required to reduce copper diffusion by more than 80% compared to the absence of the layers, are obtained by diffusion calculations. Generally, a barrier thickness from about 0.5 to 1.5 μm will safely meet the copper reduction criterion.

Layer 111 is positioned over layer 110 as an effective diffusion barrier against the up-diffusing metal used in layer 110. The intent is to de-emphasize the barrier function of the outermost layer 112, and rather emphasize its bondability function. Consequently, the thickness required for the outermost layer 112 can be reduced, thus saving cost. Examples for layer 111 are palladium, cobalt, platinum, and osmium. Examples for layer 112 are gold, platinum, and silver.

Metals used for layer 111 (such as palladium) have a diffusion coefficient for the metals used in barrier layer 110 (such as nickel) of less than $1 \times 10E-14$ cm$^2$/s at 250° C. The layer thicknesses required to reduce the up-diffusion of metal used in layer 110 by more than 80% compared to the absence of layer 111 are obtained from diffusion calculations. Generally, a thickness of layer 111 of about 0.4 to 1.5 μm will safely meet the reduction criterion for metal diffusing from layer 110.

The thickness of the bondable outermost layer 112 (such as gold) is in the range from about 0.02 to 0.1 μm.

The preferred process of depositing layers 110, 111 and 112 is by electroless plating. An example of an electroless plating process flow is described in the U.S. Patent Application quoted above. In general, electroless plating is well controlled and offers high process yield. However, it is known that some misprocessing may occasionally happen. As a result, the plated layers may have characteristics outside of the specification window. For instance, in FIG. 1, bond pad 107 shows the correct thickness for layer 110, however an off-spec thickness for layer 121 (too thin compared to layer 111, though same material), and again the correct thickness for layer 112. As another example in FIG. 1, bond pad 108 shows all three layer missing. Another example is metal shorting.

Whenever any layer deposition of the bond pad cap falls outside of specifications, it affects the IC wafer in its process flow close to the finish of a long and expensive series of manufacturing steps, i.e., it affects a wafer of very high value. Consequently, it is economically advantageous to reprocess the wafer in order to eliminate the off-spec layers, repeat the deposition, and obtain bond pad caps within specifications. According to the first embodiment of the invention, the method for reworking of misprocessed metal caps over copper-metallized bond pads comprises the following steps:

Inspecting Wafers

After completing the electroless plating process steps for the metal layers capping the bond pad copper metallization, the wafer is inspected for the quality of the deposited layers. Inspection techniques may utilize a high-magnification microscope, X-ray fluorescence equipment, and/or a profilometer based on stylus or reflected light beam. The inspection detects missing, incomplete, non-uniform, defective, or otherwise off-spec layers, or shorting between bond pads. Examples are given in FIG. 1: The cap metal layers are missing in bond pad 108, at least one layer is incomplete (too thin) in bond pad 107.

Selectively Etching Bondable Metal Layers

Figure 2:
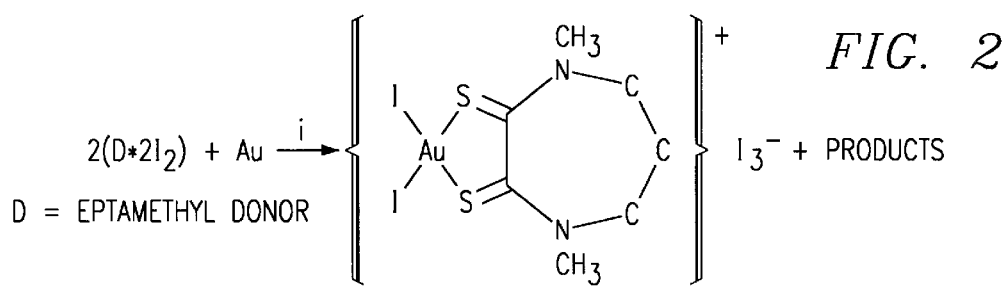
FIG. 2 is a schematic and simplified cross section of a portion of an integrated circuit wafer having off-spec bond pad metal layers, after chemically removing the bondable metal layer in the rework process according to the first embodiment of the invention.

The outermost bondable metal layer 112 in FIG. 1 is typically a thin gold layer <0.1 μm. Since traditional gold etches like aqua regia or cyanides are hazardous and/or poisonous, it is much preferred to employ a safe and inexpensive specific etchant based on a cyclic dithiooxamine compound dissolved in tetra-hydro-furane (THF) or acetone. The chemical etchant is based on seven-membered cyclic oxamines as prepared by R. Isaksson et al. ("Synthesis of some Five-, Six-, and Seven-membered Cyclic Oxamides and their Mono- and Di-thio Analogues", J. Chem. Res. (S) 1981, 43). Recently, F. Bigoli et al. have developed a specific oxidizing reagent for gold ("A powerful new Oxidation Agent towards Metallic Gold Powder: N,N'-dimethylperhydrodiazepine-2,3-dithione(D)bis (diiodine). Synthesis and X-ray structure of [AuDI2]I3"), Chem. Commun., 1998, 2351–2352). FIG. 2 reproduces the chemical reaction according to this publication by F. Bigoli. This etchant has been employed to selectively etch gold in a triple metal layer structure in GaAs semiconductor devices (M. Vanzi et al., "Selective Au-Etching on Aged GaAs-based Devices", Proc. 25$^{th}$ Internat. Symp. Testing and Failure Analysis, 1999, pp. 211–215).

The epta-methyl-bis-diiodine, or D,2I2, is prepared by mixing the donor D and I2 in a 1:2 molar ratio in CHCl3 at room temperature and obtaining orange-brown crystals after slow evaporation. The solution of these crystals in THF etches a gold layer of <0.1 μm thickness in relatively short time. The reaction is performed at ambient temperature and without protection against air and/or moisture. A similar process applies when acetone is used as the solvent.

According to the present invention, the off-spec bondable metal layer, usually gold, is selectively removed in the etch process described. The result is shown schematically in FIG. 3, where equal denotations refer to FIG. 1 for equal entities. As can be seen, this removal readily establishes the correct preconditions for a cap replacement deposition in bond pads such as 306, where the underlying barrier metal layers have been produced according to specification and thus do not have to be removed.

The cyclic oxamide compound used for selectively etching the gold is also reactive against metals, such as palladium and nickel, used as barrier layers in the metal cap over the copper-metallized bond pads. However, since electroless plating is the preferred deposition technique for the metal layer of the cap, some phosphorus complexes are admixed in the deposition process, which render the barrier layers much less reactive to the cyclic oxamide etch to the extent that the barrier layers appear actually stabilized. For example, when electroless nickel is used in the barrier layer directly overlaying the copper, approximately 12 weight % phosphorus is admixed to the nickel. When electroless palladium is used in the barrier layer on top of the nickel layer, approximately 6 weight % phosphorus is admixed to the palladium.

Iodine is an important constituent of the cyclic oxamide compound for oxidation of gold. In order to modify the oxidation potential and to adjust the etch selectivity to other metals, the iodine may be replaced by bromine, permanganate, or other elements of lower oxidation potential.

Rinsing

Selectively Etching Barrier Metal Layers

Figure 3:
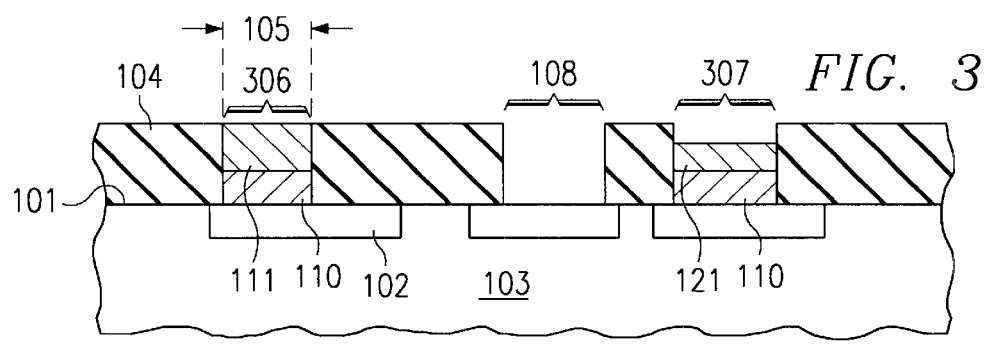
FIG. 3 is a schematic and simplified cross section of a portion of an integrated circuit wafer having off-spec bond pad metal layers, after chemically removing the bondable metal layer as well as the barrier metal layers in the rework process according to the second embodiment of the invention.

As illustrated in FIG. 3 in bond pad 307, the barrier layer may be defective and has to be removed. One needs to keep in mind that more than one metal layer may be employed to create an effective barrier structure over the bond pad copper metallization. It has been described in the above-quoted U.S. Patent Application No. 60/183,405, that there are a couple of preferred approaches to achieve an effective metal cap structure over the bond pad copper metallization:

a) The barrier layer consists of one metal. In this case, the bondable metal, usually gold, typically has a thickness of approximately 1.5 $\mu$m, and the barrier metal, preferably nickel, has a layer thickness range from 0.5 to 1.5 $\mu$m.

b) The barrier layer is a sandwich of two distinct metals layers. Commonly, a nickel layer is overlying the copper in a thickness range from 0.5 to 1.5 $\mu$m, followed by a palladium layer of less than 1.5 $\mu$m thickness. In this case, the outermost bondable gold layer is only 0.02 to 0.1 $\mu$m thick.

By way of example, FIG. 3 shows only barrier layer 121 in bond pad 307 as being defective (too thin) and in need of removal and replacement. In contrast, barrier layer 110 does not to be removed in this example, but may be defective in other examples and in need of removal.

A number of preferential etches for specific metals have been compiled in "Thin Film Processes" by John L. Vossen and Werner Kern (Academic Press, 1978). For instance, for palladium films, a mixture of 1 part hydrochloric acid, 10 parts nitric acid, and 10 parts acetic acid is recommended in order to etch 100 nm per minute.

As another example, for electroless nickel films, a mixture of 10 parts sulfuric acid, 10 parts hydrogen peroxide, 1 part phosphoric acid, 5 to 7 parts nickel sulfate in 30% solution is recommended at 50° C. in order to etch 1 to 2 $\mu$m per minute. When a significant amount of phosphorus is admixed to the nickel, the recommended selective etchant is:

a mixture of 1 part nitric acid and 1 part water; or a mixture of 9 parts phosphoric acid and 1 part nitric acid; or a mixture of 90 parts phosphoric acid, 15 parts nitric acid, 4 parts hydrochloric acid, and 1 part water.

Figure 4:
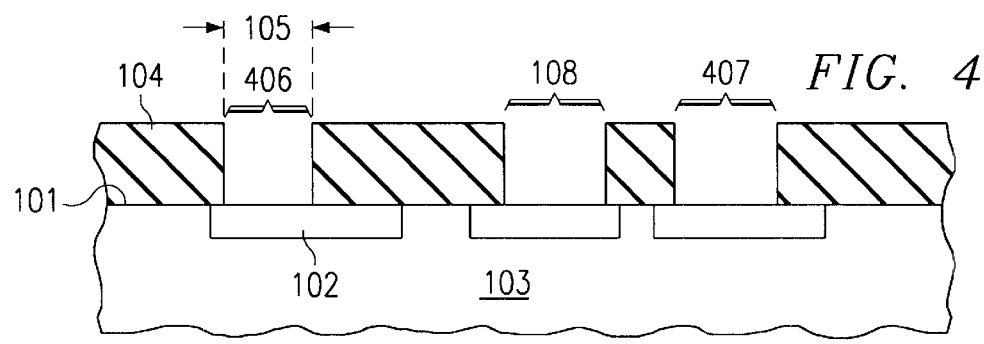
FIG. 4 illustrates the chemical reaction of a cyclic dithio-oxamide and gold, using a preferred embodiment of the invention to remove an off-spec gold layer.

FIG. 4 illustrates an example of the etching steps. In all bond pad openings 406, 108, and 407, the off-spec metal layers are removed all the way down to the copper metallization 102, leaving the openings in the protective overcoat 104 prepared for the deposition of the replacement metals of the bond pad caps. It is advisable that a careful inspection of the copper surface be performed in order to reveal any damage (such as etch attack) done to the copper surface. If damage is found, a brief electroless deposition of copper may be needed to repair the observed damage.

Whenever the need for reworking is caused by shorting of deposited metal between bond pads, it may not be necessary that all nickel be removed, but just enough that the nickel is again confined within the bond pad opening in the protective overcoat. Using the slow, controlled and uniform selective etchant described above, it may be sufficient, for instance, to remove about 300 nm nickel, thus leaving about 200 nm nickel on top of the copper metallization.

Rinsing

Depositing Replacement Metal Layers

The preferred method of forming the new bondable metal cap over the copper-metallized bond pads is by electroless deposition of metal layers as described in the above-mentioned Patent Disclosure No. 60/183,405.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention can be applied to IC bond pad metallizations other than copper, which are difficult or impossible to bond by conventional ball or wedge bonding techniques, such as alloys of refractory metals and noble metals.

As another example, the selective chemical etching method of the invention may be extended to include the removal of the copper layer of the bond pads. In this case, it may be advisable to etch the copper all the way to the tantalum nitride barrier. At this point, electroless copper is used to replace the etched copper, followed by the electroless deposition of the metal cap layers. Alternatively, the copper can be seeded by sputtering, followed by an electrochemical deposition step.

It is therefore intended that the appended claims encompass any such modifications or embodiments.

We claim:

1. A method for reworking integrated circuit wafers having an active surface including copper-metallized bond pads covered by deposited layers of a barrier metal and a bondable metal, comprising the steps of:

inspecting said wafers in order to identify those of said wafers which have off-spec metal layers;

chemically etching said active surface of said off-spec wafers using selective etchants consecutively until said metal layers over said bond pads are removed without damaging said copper metallization; and depositing replacement metal layers over said bond pads.

2. The method according to claim 1 wherein said metal layers comprise at least one bondable metal.

3. The method according to claim 1 wherein said metal layers may be a single layer or a stack of two, three or four layers selected from a group consisting of platinum, rhodium, iridium, osmium, palladium, tin, nickel, cobalt, chromium, molybdenum, titanium, tungsten, gold, silver, aluminum and alloys thereof.

4. The method according to claim 3 wherein said metal layer stack provides at least one layer of barrier metal, overlaying said copper and blocking copper diffusion, and at least one layer of bondable metal, overlaying said barrier layer.

5. The method according to claim 1 wherein said layer deposition is electroless plating.

6. The method according to claim 1 wherein said off-spec layers include missing, incomplete, or defective layers, or layers otherwise not meeting specified characteristics.

7. The method according to claim 6 wherein said specified characteristics include layer thickness and uniformity.

8. The method according to claim 1 wherein said selective etchants provide a first etchant specific for etching said bondable metal, followed by a rinsing step.

9. The method according to claim 8 wherein said etchant specific for said bondable metal is based on a cyclic dithio-oxamine compound dissolved in tetra-hydro-furane or acetone.

10. The method according to claim 9 wherein said compound is epta-methyl-bis-diiodine, or the bis-diiodine adduct of N,N'-dimethylperhydrodiazepine-2,3-dithione.

11. The method according to claim 1 wherein said selective etchants provide a second etchant specific for etching said barrier metal, followed by a rinsing step.

12. The method according to claim 11 wherein said etchant specific for said barrier metal is based on oxidizing inorganic and organic acids.

13. The method according to claim 12 wherein said oxidizing acids are selected from a group consisting of hydrochloric acid, nitric acid, sulfuric acid, phosphoric acid, acetic acid, and hydrogen peroxide.

14. The method according to claim 1 further comprising the step of inspecting said wafer after said chemical etching step in order to reveal any damage to the surface of said copper metallization and to decide whether an electroless copper deposition step is needed for repairing said damage.

* * * * *